(12) United States Patent
Nilson et al.

(10) Patent No.: US 6,570,450 B2
(45) Date of Patent: May 27, 2003

(54) EFFICIENT AC COUPLED CMOS RF AMPLIFIER

(75) Inventors: Christopher D. Nilson, San Jose, CA (US); Thomas G. McKay, Felton, CA (US)

(73) Assignee: Zeevo, Inc., Santa Clara, CA (US)

( * ) Notice: Subject to any disclaimer, the term of this patent is extended or adjusted under 35 U.S.C. 154(b) by 0 days.

(21) Appl. No.: 09/825,252

(22) Filed: Apr. 2, 2001

(65) Prior Publication Data

US 2002/0140509 A1 Oct. 3, 2002

(51) Int. Cl.[7] ................ H03F 3/18; H03F 3/26; H03F 3/16
(52) U.S. Cl. ............... 330/264; 330/267; 330/277
(58) Field of Search ............................. 330/264, 277, 330/267

(56) References Cited

U.S. PATENT DOCUMENTS

| 4,352,073 A | * | 9/1982 | Leuthold | 330/264 |
| 4,403,198 A | * | 9/1983 | Muller | 330/264 |
| 4,797,630 A | * | 1/1989 | Brown | 330/264 |
| 4,996,499 A | * | 2/1991 | Zarabadi et al. | 330/264 |
| 5,568,093 A | * | 10/1996 | Holzer | 330/264 |

* cited by examiner

Primary Examiner—Patricia Nguyen
(74) Attorney, Agent, or Firm—Townsend and Townsend and Crew LLP; Henry K. Woodward

(57) ABSTRACT

Disclosed is a CMOS transistor amplifier for small RF signals which operates in a Class AB mode. The serially connected P channel and N channel transistors of the CMOS transistor pair have DC bias voltages applied to the control gates, and the small input signal is capacitively coupled to the gates of the CMOS transistor pair. In a preferred embodiment, the DC voltage bias for the P channel transistor is derived from a second P channel transistor which is approximately identical to the first P channel transistor in structure with the second P channel transistor serially connected with the current source and the voltage at the gate/drain of the transistor resistively coupled to the gate of the first P channel transistor. Similarly, the second bias circuit comprises a second N channel transistor which is approximately identical in structure to the first N channel transistor with the second N channel transistor serially connected with a current source and the bias voltage taken at the gate/drain of the second N channel transistor. The bias voltage is then applied through resistive means to the gate of the first N channel transistor.

9 Claims, 1 Drawing Sheet

Class AB Operation

Class AB Operation

US 6,570,450 B2

EFFICIENT AC COUPLED CMOS RF AMPLIFIER

BACKGROUND OF THE INVENTION

This invention relates generally to semiconductor RF amplifiers, and more particularly the invention relates to a CMOS semiconductor amplifier which has improved operating efficiency.

Cascaded multistage amplifiers are used to create power gain for a small (e.g., 200 mV) high frequency RF signal. Class A amplifiers, which draw current continuously, are needed for small input signals but are inefficient in operation. Class AB amplifiers do not draw current continuously but require larger input signals for efficient operation. Thus, a class A amplifier stage has typically been used with small signals to provide larger signals to following class AB amplifier stages.

The present invention is directed to providing a more efficient small signal amplifier by using only Class AB amplifier stages.

SUMMARY OF THE INVENTION

In accordance with the invention a CMOS RF amplifier is provided for amplifying a small input signal by first providing DC bias voltages to the CMOS transistor gates, and capacitively coupling a small input signal to the voltage biased gates. In effect, the small input signal becomes a larger gate voltage in driving the RF amplifier in an AB operation mode.

In a preferred embodiment, the DC bias voltages are taken from a P transistor which is approximately identical to the P transistor of the CMOS transistor pair, the P transistor being connected to a current source for generating a gate voltage that is resistively coupled to the gate of the P channel transistor of the CMOS transistor pair. Similarly, a N channel transistor is connected with a current source for generating a gate voltage which is resistively coupled to the gate of the N transistor of the CMOS transistor pair. The N channel transistors are approximately identical in structure.

The invention and objects and features thereof will be more readily apparent from the following detailed description and dependent claims when taken with the drawings.

DETAILED DESCRIPTION OF ILLUSTRATIVE EMBODIMENTS

Figure 1:
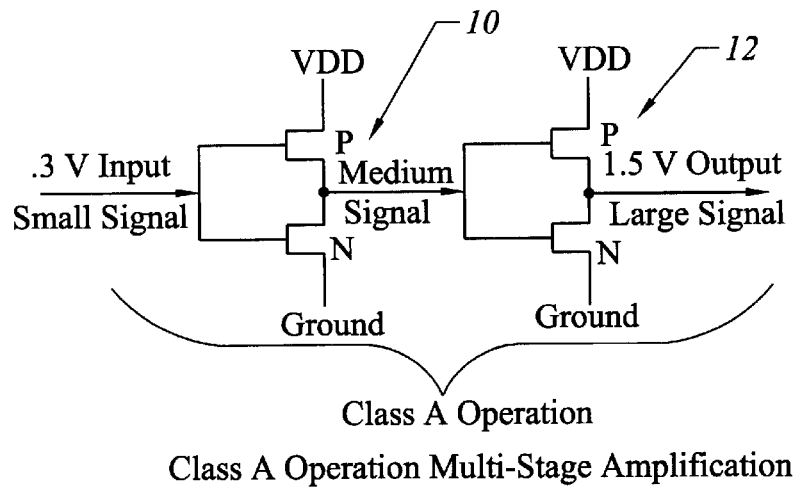
FIG. 1 is a schematic of a conventional two stage CMOS transistor amplifier operating in Class A mode.

FIG. 1 is a schematic of a conventional two stage CMOS transistor amplifier for Class A operation. The first stage 10 comprises a P channel transistor serially connected with an N channel transistor between two voltage potentials, VDD (e.g. 1.8 volts) and ground. A small input signal (0.3 volt) is applied to the gate terminals of the first CMOS transistors of amplifier 10, and a medium scale output signal is taken at the common terminal of the first CMOS transistor pair. The medium signal is then applied to a second stage 12 of the amplifier comprising a second CMOS transistor pair with the medium signal applied to the gates of the CMOS transistors of stage 12. A large voltage (1.5 V) output signal is then taken at the common terminal of the second CMOS transistor pair.

The small input signal causes the amplifier to consume a large amount of current due to the Class A operation. An objective of the present invention is to increase the operating efficiency of a CMOS RF amplifier for small input signals.

Figure 2:
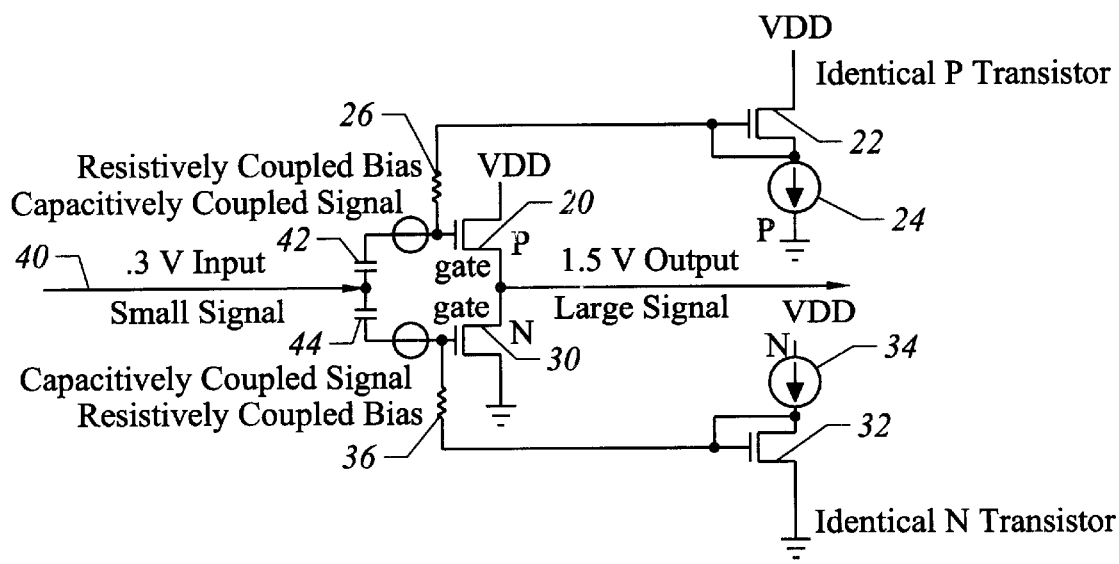
FIG. 2 is a schematic of an input stage CMOS transistor amplifier operating in Class AB mode in accordance with an embodiment of the invention.

FIG. 2 is a schematic of one embodiment of a CMOS amplifier for small input signals in accordance with an embodiment of the invention which can be more efficiently operated in Class AB mode. This is accomplished by applying DC bias potentials to the gate terminals of the P channel transistor 20 and N channel transistor 30 of the amplifier, and by capacitively coupling the AC input signal to the gates of the CMOS transistors. In this embodiment, the gate bias for P channel transistor 20 is derived from a P channel transistor 22 which is approximately identical in structure with transistor 20. Transistor 22 is serially connected with a first current source 24 between VDD and circuit ground, and the drain-gate voltage of transistor 22 is resistively coupled through resistor 26 to the gate of transistor 20.

Similarly, the DC bias voltage for N channel transistor 30 of the CMOS transistor pair is derived from N channel transistor 32 which is approximately identical to transistor 30 in physical configuration. Transistor 32 is serially connected with a second current source 34 between VDD and circuit ground, and the drain-gate voltage of transistor 32 is applied through resistor 36 to the gate of transistor 30. With a VDD of approximately 1.8 V, the DC bias voltage applied to transistor 20 is on the order of 0.8 V, and the DC bias applied to the gate of transistor 30 is on the order of 1.0 V for an input signal of 0.3V. The input signal applied at terminal 40 is applied through capacitors 42, 44 to the gates of transistor 20 and transistor 30, respectively. With this arrangement, a 1.5 V output large signal is derived directly from the 0.3V input with the transistor pair operating in an Class AB mode of operation.

The P bias and N bias for transistors 20, 30 are performed symmetrically. This controls the average current flowing through resistors 26, 36 and does not interfere with the fast moving RF signal that is capacitively coupled separately to the gates.

The circuit illustrated in FIG. 2 is more efficient and consumes significantly less current than the conventional circuit shown in FIG. 1 in amplifying a small input signal. Further, the bias circuitry does not interfere with the fast RF signal which is capacitively coupled to the CMOS transistor gates and allows the amplifier to operate in a highly efficient Class AB mode with a small to medium amplitude at the input.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A CMOS transistor amplifier for amplifying a small RF signal in Class AB operating mode comprising:
   a) a first P channel transistor serially connected with a first N channel transistor, each of the first transistors having a gate terminal for controlling the conduction of the transistor,
   b) a first bias circuit for applying a first DC bias voltage to the gate of the first P channel transistor, the first bias circuit comprising a second P channel transistor serially connected with a first current source, the first bias voltage being taken at the gate and drain of the second P channel transistor and a second bias circuit for applying a second DC bias voltage to the gate of the first N channel transistor, the second bias circuit comprising a second N channel transistor serially connected with a second current source, the second bias voltage being taken at the gate/drain of the second N channel transistor, wherein the first DC bias voltage is applied through a first resistor to the gate of the first P channel transistor, and the second DC bias voltage is applied through a second resistor to the gate of the first N channel transistor, c) an input circuit for capacitively coupling a small RF input signal to the gate of the first P channel transistor and to the gate of the first N channel transistor, and d) an output circuit connected to a common terminal of the serially connected first transistors.

2. The CMOS transistor amplifier as defined by claim 1 wherein the first and second P channel transistors are approximately identical in structure, and the first and second N channel transistors are approximately identical in structure.

3. The CMOS transistor amplifier as defined by claim 2 wherein the input circuit comprises a first capacitor coupling the input signal to the gate of the first P channel transistor, and a second capacitor capacitively coupling the input signal to the gate of the first N channel transistor.

4. The CMOS transistor amplifier as defined by claim 3 wherein the output circuit comprises a conductor connected to the common terminal.

5. The CMOS transistor amplifier as defined by claim 4 wherein the first P channel transistor and the first N channel transistor are serially connected between two voltage potentials (VDD, ground), the second P channel transistor and the first current source are serially connected between the two voltage potentials, and the second N channel transistor and the second current source are serially connected between the two voltage potentials.

6. A CMOS transistor amplifier for amplifying a small RF signal in Class AB operating mode comprising:

a) a first P channel transistor serially connected with a first N channel transistor, each of the first transistors having a gate terminal for controlling the conduction of the transistor, b) a first bias circuit for applying a first DC bias voltage to the gate of the first P channel transistor, the first bias circuit comprising a second P channel transistor serially connected with a first current source, the first bias voltage being taken at the gate and drain of the second P channel transistor and a second bias circuit for applying a second DC bias voltage to the gate of the first N channel transistor, the second bias circuit comprising a second N channel transistor serially connected with a second current source, the second bias voltage being taken at the gate/drain of the second N channel transistor, wherein the first and second P channel transistors are approximately identical in structure, and the first and second N channel transistors are approximately identical in structure, and wherein the first P channel transistor and the first N channel transistor are serially connected between two voltage potentials (VDD, ground), the second P channel transistor and the first current source are serially connected between the two voltage potentials, and the second N channel transistor and the second current source are serially connected between the two voltage potentials, and wherein the first DC bias voltage is applied through a first resistor to the gate of the first P channel transistor, and the second DC bias voltage is applied through a second resistor to the gate of the first N channel transistor, c) an input circuit for capacitively coupling a small RF input signal to the gate of the first P channel transistor and to the gate of the first N channel transistor, wherein the input circuit comprises a first capacitor coupling the input signal to the gate of the first P channel transistor, and a second capacitor capacitively coupling the input signal to the gate of the first N channel transistor, and d) an output circuit connected to a common terminal of the serially connected first transistors, wherein the output circuit comprises a conductor connected to the common terminal.

7. The CMOS transistor amplifier as defined by claim 5 wherein the two voltage potentials are approximately 1.8 V and ground, the input signal is approximately 0.3 V, and the output signal is approximately 1.5 V.

8. The CMOS transistor amplifier as defined by claim 1 wherein the first P channel transistor and the first N channel transistor are serially connected between two voltage potentials, the second P channel transistor and the first current source are serially connected between the two voltage potentials, and the second N channel transistor and the second current source are serially connected between the two voltage potentials.

9. The CMOS transistor amplifier as defined by claim 1 wherein the input circuit comprises a first capacitor coupling the input signal to the first P channel transistor and a second capacitor coupling the input signal to the first N channel transistor, and the output circuit comprises a conductor connected to the common terminal.

* * * * *